US012580586B2

(12) United States Patent (10) Patent No.: US 12,580,586 B2
Zarudniev et al. (45) Date of Patent: Mar. 17, 2026

(54) METHOD OF COMPRESSED SENSING AND RECONSTRUCTION OF A SPECTRALLY-SPARSE SIGNAL

(71) Applicant: COMMISSARIAT A L'ENERGIE ATOMIQUE ET AUX ENERGIES ALTERNATIVES, Paris (FR)

(72) Inventors: Mykhailo Zarudniev, Grenoble Cedex (FR); Michael Pelissier, Grenoble Cedex (FR); Jorge-Luis Gulfo Monsalve, Grenoble Cedex (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 562 days.

(21) Appl. No.: 18/147,569

(22) Filed: Dec. 28, 2022

(65) Prior Publication Data

US 2023/0208438 A1 Jun. 29, 2023

(30) Foreign Application Priority Data

Dec. 29, 2021 (FR) ...................................... 21 14628

(51) Int. Cl.
*H03M 7/30* (2006.01)
*H03M 1/12* (2006.01)
(52) U.S. Cl.
CPC ......... *H03M 7/3062* (2013.01); *H03M 1/126* (2013.01)
(58) Field of Classification Search
CPC .. H03M 7/3062; H03M 1/126; H04L 27/0004
See application file for complete search history.

(56) References Cited

U.S. PATENT DOCUMENTS 8,717,210 B2 * 5/2014 Eldar .................... H03M 1/121
341/122
10,066,997 B2 9/2018 Körner et al.
(Continued)

FOREIGN PATENT DOCUMENTS

EP 3 319 236 A1 5/2018
EP 3 681 040 A1 7/2020
(Continued)

OTHER PUBLICATIONS

French Preliminary Search Report issued Jul. 27, 2022 in French Application 21 14628, filed on Dec. 29, 2021 (with English Translation of Categories of cited documents and Written Opinion), citing documents 1-4, 15-16 and 25 therein, 10 pages.
(Continued)

*Primary Examiner* — Mi'schita' Henson
(74) *Attorney, Agent, or Firm* — Oblon, McClelland, Maier & Neustadt, L.L.P.

(57) ABSTRACT

A method is provided for performing compressed sensing of a spectrally-sparse signal within a given spectral band. The received signal being mixed over a sensing frame with a pulse train scrolling with a repetition frequency linearly modulated over time within this frame. The result of mixing is filtered by low-pass filtering and sampled at a non-uniform rate equal to the repetition frequency, to result in complex samples representative of the received signal. The spectrum of the received signal can be estimated by weighting, using the complex samples, the spectral values of a pulse into a plurality of frequency equidistributed in the band, and by summing up these weighted values for each of these frequencies. An estimate of the received signal is thereby deduced by inverse Fourier transform. The spectral band can be scanned based on the spectrum thus estimated.

11 Claims, 10 Drawing Sheets

(56) References Cited

U.S. PATENT DOCUMENTS

| | | | |
|---|---|---|---|
| 10,236,006 B1 * | 3/2019 | Gurijala | G10L 19/02 |
| 10,574,277 B2 * | 2/2020 | Terry | H04B 7/00 |
| 2017/0059408 A1 | 3/2017 | Körner et al. | |
| 2018/0131504 A1 | 5/2018 | Pelissier et al. | |
| 2020/0220751 A1 | 7/2020 | Pelissier et al. | |
| 2024/0133980 A1 * | 4/2024 | Nikolovski | G01R 33/028 |

FOREIGN PATENT DOCUMENTS

| | | | | |
|---|---|---|---|---|
| EP | 4564055 A1 * | 6/2025 | | G01S 13/0209 |
| WO | WO-2007050680 A2 * | 5/2007 | | H03M 13/11 |

OTHER PUBLICATIONS

Pelissier, M. et al. "Non-Uniform Wavelet Sampling for RF Analog-to-Information Conversion" IEEE Transactions on Circuits and Systems I: Regular Papers, 2017 (14 pages).
De Vito, L. et al. "Non-Uniform Wavelet Bandpass Sampling Analog-to Information Converter: A hardware implementation and its experimental assessment", Measurement vol. 134, 2019, (11 pages).

* cited by examiner

METHOD OF COMPRESSED SENSING AND RECONSTRUCTION OF A SPECTRALLY-SPARSE SIGNAL

TECHNICAL FIELD

The present invention generally relates to the field of compressed sensing and of spectral sensing. In particular, it applies to detection and frequency localisation in Wi-Fi signals.

PRIOR ART

Compressed sensing of a signal is based on the following theoretical foundation: a spectrally-sparse signal in a given spectral band, i.e. whose information is not contained within the entirety of the considered band but only in one or more of its sub-band(s), can be sampled with no losses provided that its sampling frequency is close to the Landau frequency, i.e. to its actual information bandwidth. For a spectrally-sparse signal, the Landau frequency could be substantially lower than the Nyquist frequency.

In the case where the signal to be sensed is a multi-band RF signal, in other words in the case where it occupies some sub-bands of a given spectral band, it is known to resort to band-pass sub-sampling (also called bandwidth sampling), more specifically to non-uniform wavelet band-pass sampling or NUWBS. The latter uses a dictionary of elementary functions forming a base, and possibly simply a generator family (overcomplete) of $L^2(\mathbb{R})$, called wavelets. A detailed description of the NUWBS sensing method will be found in the article of M. Pelissier et al. entitled "Non-uniform wavelet sampling for RF analog-to-information conversion", published in IEEE Trans. On Circuits and Systems, I, Regular Papers, 2018, 65(2), pp. 471-484 as well as in the application EP-A-3 319 236.

The NUWBS sensing method is briefly recalled hereinafter in the context of a RF receiver represented in FIG. 1. The received RF signal to be sensed, x(t), noised by a Gaussian additive white noise, n(t), can occupy one or more sub-band(s) (or channels) of a sensing frequency band with a width $BW_{RF}$, centred on a carrier frequency, $f_c$. The received signal is first amplified in a low-pass amplifier (LNA), 110, then mixed by means of a multiplier 120, with a pulse train (for example Morlet wavelets), $p_{NUWBS}{}^{(t)}$. Afterwards, the results of mixing is filtered and amplified by an automatic gain control amplifier, 130, before being sampled at the time points where the different pulses are present and converted by an analog-to-digital converter, 140. In practice, the multiplication is carried out on complex values and the amplification as well as the A/D conversion are performed for each channel I and Q.

FIG. 2 represents, in its lower portion, an example of a pulse train, $p_{NUWBS}(t)$. The pulse train has an overall duration $T_{acq}$, the pulses being repeated with a maximum repetition frequency PRF, or, in an equivalent manner all intervals $$\frac{1}{PRF}.$$

In general, a pulse train comprises at most $\Sigma$ possible time positions equidistributed over the sensing duration $T_{acq}$, wherein $M \leq \Sigma$ are actually occupied by pulses, the other positions being unoccupied. The ratio $M/\Sigma$, also called compression ratio, defines the occupancy ratio of the pulse train over the sensing duration, $T_{acq}$. The duration r of one pulse is selected so as to be in the range of the inverse of the bandwidth, $BW_{RF}$, of the signal to be sensed. The bandwidth $BW_{RF}$ is determined on the basis of a predetermined attenuation value in dB, generally −3 dB. Furthermore, the carrier frequency of the pulse is selected substantially equal to the frequency $f_c$.

The spectrum of a pulse train is represented in the upper portion of FIG. 2. The latter is a spectrum of lines spaced apart by the repetition frequency PRF, centred on the carrier frequency, $f_c$ and modulated by the spectral shape of the envelope of a pulse.

The central portion of the figure, represents a spectrogram of a pulse train, i.e. a time-frequency analysis corresponding to the Fourier transform of a pulse train being repeated periodically with the period $T_{acq}$. It should be noticed that the spectrogram features lines substantially aligned with those of the spectrum hereinabove and remains constant over time.

Returning back to FIG. 1, the pulse train, $p_{NUWBS}(t)$, mixed with the received signal, is characterised by its compression ratio, $M/\Sigma$, the carrier frequency, $f_c$, and the duration, $\tau$, of its pulses, as well as the maximum repetition frequency, $$PRF = \frac{\Sigma}{T_{acq}}.$$

The average repetition frequency of the pulses is simply $(M/\Sigma)PRF$.

The NUWBS sampling is non-uniform because of the random distribution of M pulses among the $\Sigma$ time positions within the sensing frame. For a given compression ratio, the pulses are selected by means of a pseudo-random draw by a PRBS sequence (Pseudo-Random Binary Sequence).

The compression ratio $M/\Sigma$ determines, on the one hand, the maximum degree of spectral sparsity that the receiver could reach and, on the other hand, the average rate at which the analog-to-digital converter should operate.

FIG. 3A represents a histogram of the repetition frequency of the pulses, in other words the probability density of the repetition frequency of the pulses for a compression ratio of $M/\Sigma=0.1$. It should be noticed that this repetition frequency takes on fractional values of the maximum repetition frequency, PRF: PRF/2, PRF/3, PRF/4, etc.

FIGS. 3B and 3C represent the repetition frequency density of the pulses, respectively for a compression ratio $M/\Sigma=0.5$ and $M/\Sigma=0.9$. It should be noticed that when the compression ratio increases, the distribution of the probability density of the repetition frequency tends to concentrate on the maximum value, PRF. This concentration is problematic to the extent that the conversion rate of the analog-to-digital converter must follow the maximum repetition frequency of the pulse train, the latter further having to be equal to the bandwidth $BW_{RF}$ if the entirety of the band is to be analysed or sensed. In other words, the NUWBS compressed sensing method as described in the prior art supposes resorting to fast A/D converters to analyse or sense wide band signals. Yet, such converters are expensive and do not feature great dynamics.

Consequently, the present invention aims to provide a compressed sensing method allowing sensing a signal/analysing a wide RF band and, where appropriate, reconstructing the signal present therein, without having to resort to ADC converters operating at a high rate, in the range of the considered bandwidth.

DISCLOSURE OF THE INVENTION

The present invention is defined by a method of compressed sensing of a spectrally-sparse signal within a given spectral band, the received signal being mixed over a sensing frame with a pulse train scrolling at a repetition frequency within this frame, said pulses having a duration shorter than or equal to the inverse of the width of the spectral band and having a spectrum centred on the central frequency of this band, the result of mixing being filtered by means of a low-pass filtering before being sampled to result in complex samples representative of the received signal, said method being original in that said repetition frequency is modulated over time for the duration of the sensing frame.

The sensing methods according to the present disclosure are applicable to digital signals, yet especially and preferably to analog signals. In this case, in some embodiments, the pulse train is in an analog form and is mixed with the signal also in an analog form.

In some variants of these embodiments, the result of mixing is then filtered and sampled in an analog form, then converted in a digital form by an analog-to-digital converter.

Advantageously, the repetition frequency is linearly modulated overtime.

In some embodiments, the repetition frequency covers, over the sensing frame, a range of repetition frequencies between a minimum value $PRF_{min}$ and a maximum value $RF_{max}$, either increasingly, or decreasingly.

Preferably, the modulation swing (or deviation) of the repetition frequency ($B_{in}$) is selected so that the spectral width scanned covered by each spectral line of the pulse train, $B_{sweep}{}^k = (k_{mult} + k - 1)$. $B_{in}$ is such that $B_{sweep}{}^k > PRF_{min}$ where $k_{mult}$ is the integer defined by $k_{mult}$, $f_c$ is said central frequency, and $\overline{PRF}$ is the average repetition frequency of the pulses for the duration of the sensing frame.

In some embodiments, the modulation swing of the repetition frequency ($B_{in}$) is selected so that, for at least one k-order spectral line of the pulse train (and preferably for a plurality of these lines), the spectral width $B_{sweep}{}^k$ covered by said at least one k-order spectral line is larger than the average repetition frequency $\overline{PRF}$ of the pulses for the duration of the sensing frame.

Thus, according to different variants, for at least one and preferably for a plurality of sub-bands generated by different harmonics, there is no spectral overlap of the sub-band(s) over the duration of the ramp.

The pulses are typically selected from Morlet wavelets, Haar wavelets and Gabor functions.

Advantageously, the low-pass filter has a cut-off frequency substantially equal to $\overline{PRF}/2$ where $\overline{PRF}$ is the average repetition frequency of the pulses for the duration of the sensing frame.

According to one variant, the received signal is mixed over a sensing frame with a first pulse train scrolling at a first repetition frequency within this frame, and over this same sensing frame, is mixed with a second pulse train scrolling with a second repetition frequency, the first and second repetition frequencies being linearly modulated over time over the sensing frame.

Afterwards, the result of mixing with the first pulse train is filtered by means of a first low-pass filtering before being sampled to result in first complex samples, and the result of mixing with the second pulse train is filtered by means of a second low-pass filtering before being sampled to result in second complex samples, all of the first and second complex samples being representative of the received signal.

The invention further relates to a method of reconstructing a spectrally-sparse signal within a given spectral band, said signal having undergone a compressed sensing by a compressed sensing method as indicated hereinabove, the complex samples relating to the different pulses of the pulse train being successively multiplied by spectral values of these pulses to result in weighted spectral values, this operation being repeated for a plurality of frequencies equidistributed over the spectral band, said weighted spectral values being summed up for the duration of the sensing frame for each frequency of the plurality of equidistributed frequencies to obtain complex coefficients at each of these frequencies, phasors at these frequencies being then weighted by said corresponding coefficients before being summed up to result in an estimate of the received signal.

BRIEF DESCRIPTION OF THE FIGURES

Other features and advantages of the invention will appear upon reading a preferred embodiment of the invention, made with reference to the appended figures wherein.

DESCRIPTION OF THE EMBODIMENTS

Figure 1:
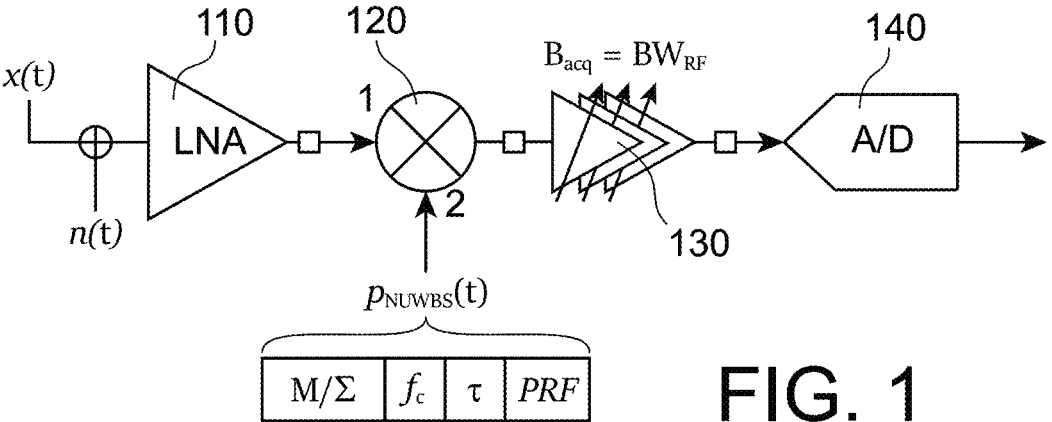
FIG. 1 schematically represents a RF receiver using a method of compressed sensing by NUWBS sampling, known from the prior art.
Figure 2:
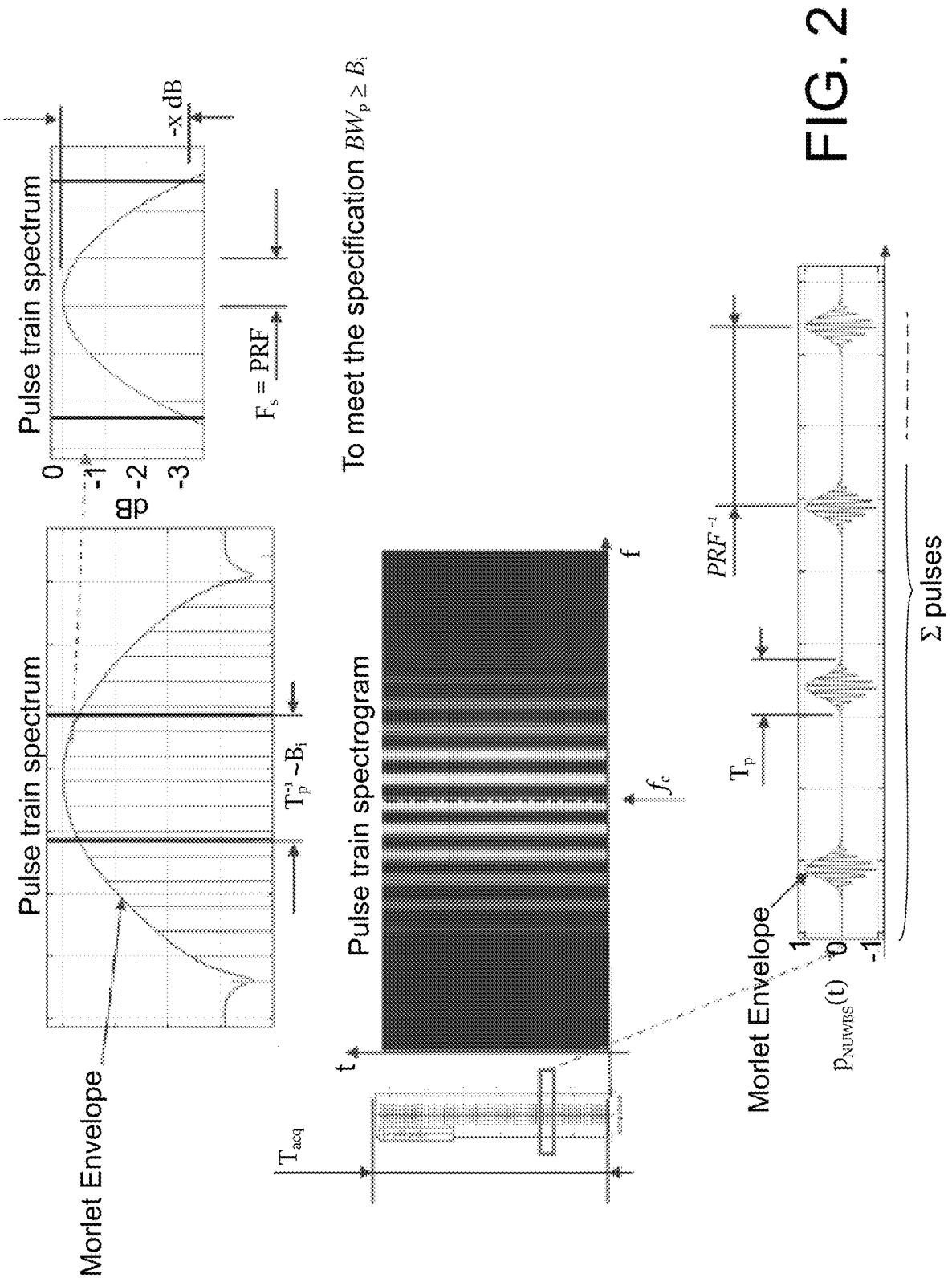
FIG. 2 represents an example of a pulse train used in the RF receiver of FIG. 1.
Figure 3A:
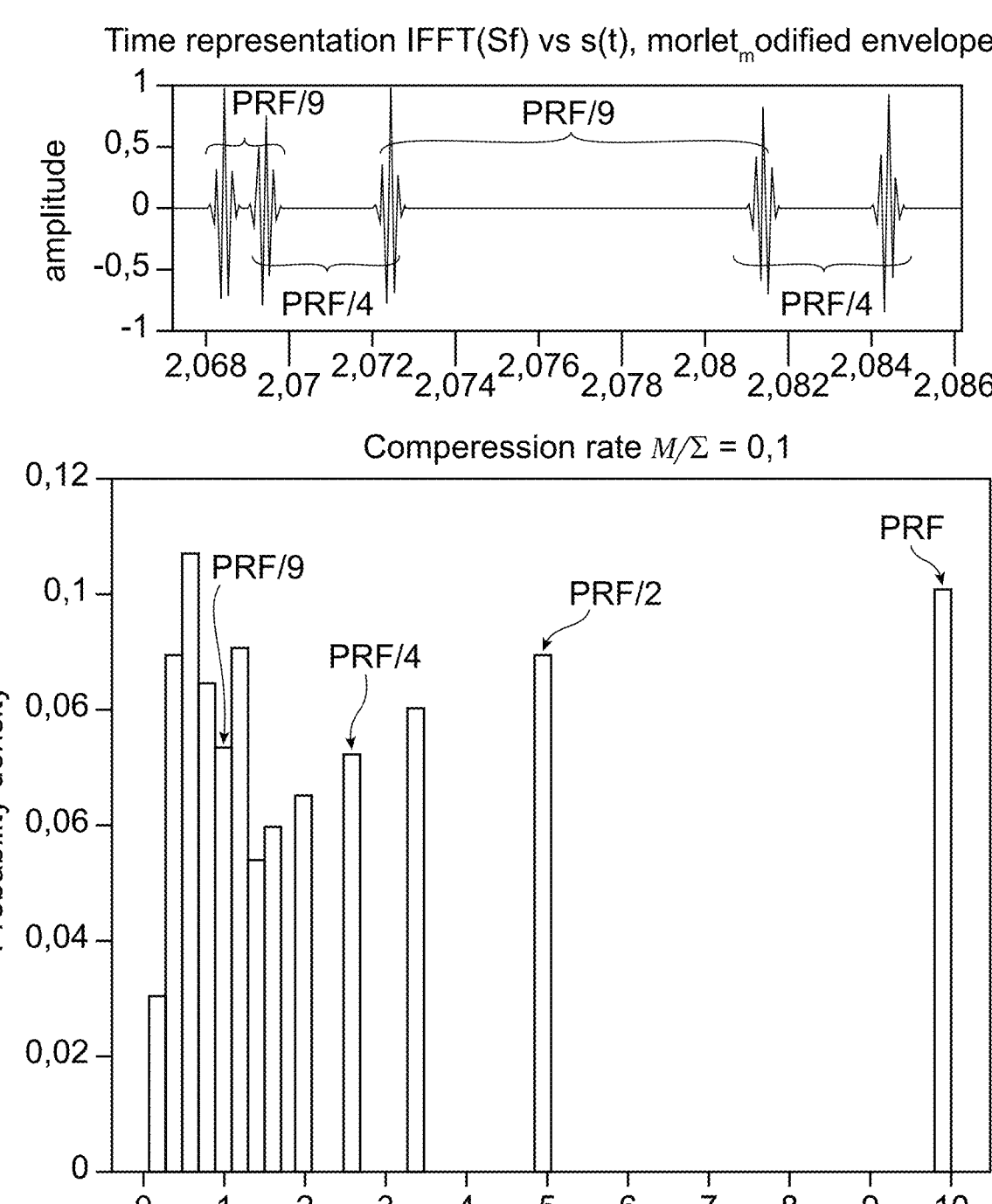
FIG. 3A, FIG. 3B and FIG. 3C represents repetition frequency histograms for examples of pulse trains having different compression ratios.
Figure 3C:
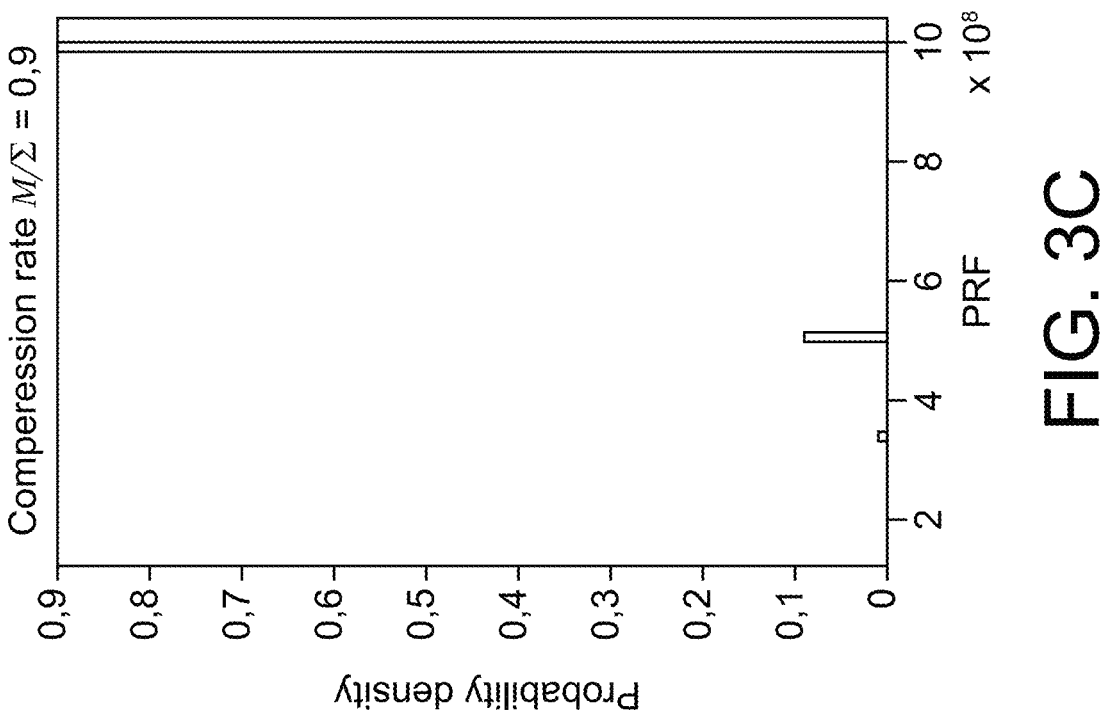
Figure 3B:
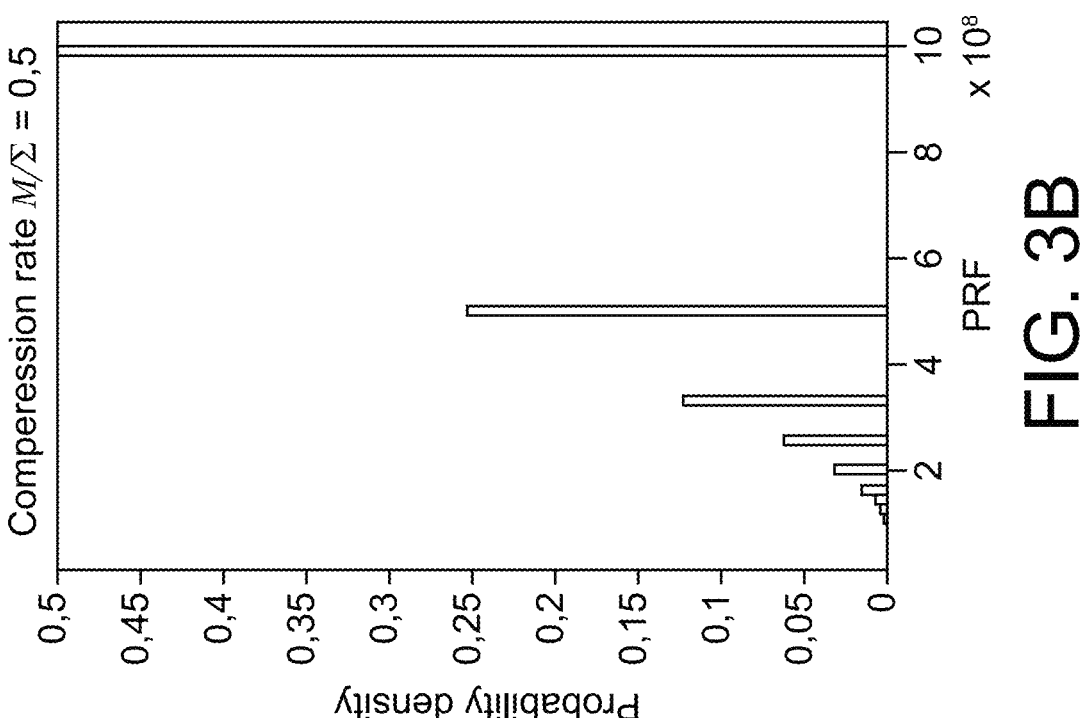

Next, we will consider a device implementing a method of compressed sensing by non-uniform sampling, NUWBS, as described in the introductory part. The compressed sensing involves mixing of the signal to be sensed with pulse trains distributed within one frame. The pulses may consist of Morlet wavelets, Haar wavelets or Gabor functions, in a manner known per se.

Unlike the prior art described in the introductory part, the pulses are not located at $\Sigma$ predetermined time positions, given by the repetition period $$\frac{1}{PRF},$$

decimated by means of the compression ratio M/Σ so as to retain only M out of Σ.

According to a first idea at the origin of the invention, over a sensing frame with a duration $T_{acq}$, the repetition frequency is modulated around an average value, denoted $\overline{PRF}$, with a linear frequency ramp with a slope of 2α.

In other words, the repetition frequency of the pulses within a frame varies between the values:

[Math. 1]

$$f_{start} = \overline{PRF} - \alpha T_{acq} = \overline{PRF} - \frac{B_{in}}{2} \qquad (1\text{-}1)$$

[Math. 2]

$$f_{stop} = f_{start} + 2\alpha T_{acq} = \overline{PRF} + \alpha T_{acq} = \overline{PRF} + \frac{B_{in}}{2} \qquad (1\text{-}2)$$

where $B_{in} = 2\alpha T_{acq}$ is the swing of the PRF for the duration of the sensing frame.

Preferably, the time positions indicating the start of the pulses within the frame are selected such that the phase variation due to the modulation of the PRF is an integer multiple of 2π.

For example, in the present embodiment, these time positions are given by the time points $t_k$ meeting:

[Math. 3]

$$2\pi(f_{start}t_k + \alpha t_k{}^2) = 2\pi k; t_k \in [0, T_{acq}] \qquad (2)$$

where:

[Math. 4]

$$t_k = \frac{f_{start}}{2\alpha}\left(-1 + \sqrt{1 + \frac{2\alpha}{f_{start}}(2k-1)}\right) \qquad (3)$$

In other words, the time positions of the pulses are those for which the phase variation due to the modulation of the PRF is an integer multiple of 2π. When the repetition frequency increases linearly over the duration of the frame (α>0), the pulses become increasingly close to one another. Conversely, when the repetition frequency decreases linearly over the duration of the frame (α<0), the pulses become increasingly spaced apart.

In fine, the pulse train can be expressed in the form:

[Math. 5]

$$p_c(t) =$$

$$s_{pulse}(t) \otimes \sum_{k=1}^{N_{max}} \delta(t - t_k) = s_{pulse}(t) \otimes \left(\prod_{[0,T_{acq}]}(t) \cdot \sum_k \delta(t - t_k)\right) \qquad (4)$$

where $\Pi_{[0,T_{acq}]}(t)$ is the gate function (also called the rectangular function) over [0, $T_{acq}$] and $\Sigma_k \delta(t-t_k)$ is a Dirac comb (non-uniform if α≠0).

For example, in the case where the pulses are Morlet wavelets, the pulse train could then be written:

[Math. 6]

$$p_c(t) = \sum_{k=1}^{N_{max}} \exp\left(-\frac{(t - t_k - \tau/2)^2}{2(\tau/6)^2}\right) \cdot \exp(j2\pi f_c(t - t_k)) \qquad (5)$$

where τ is the width of the Gaussian envelope of the pulses.

In general, the spectrum of the pulse train is expressed as follows:

[Math. 7]

$$P_c(f) = S_{pulse}(f - f_c) \cdot \left(\text{sinc}\left(\frac{f}{T_{acq}^{-1}}\right) \otimes TF\left(\sum_k \delta(t - t_k)\right)\right) \qquad (6)$$

where $S_{pulse}(f)$ is the spectrum of the baseband pulse, sinc is the cardinal sine function, and TF is Fourier transform.

Figure 4:
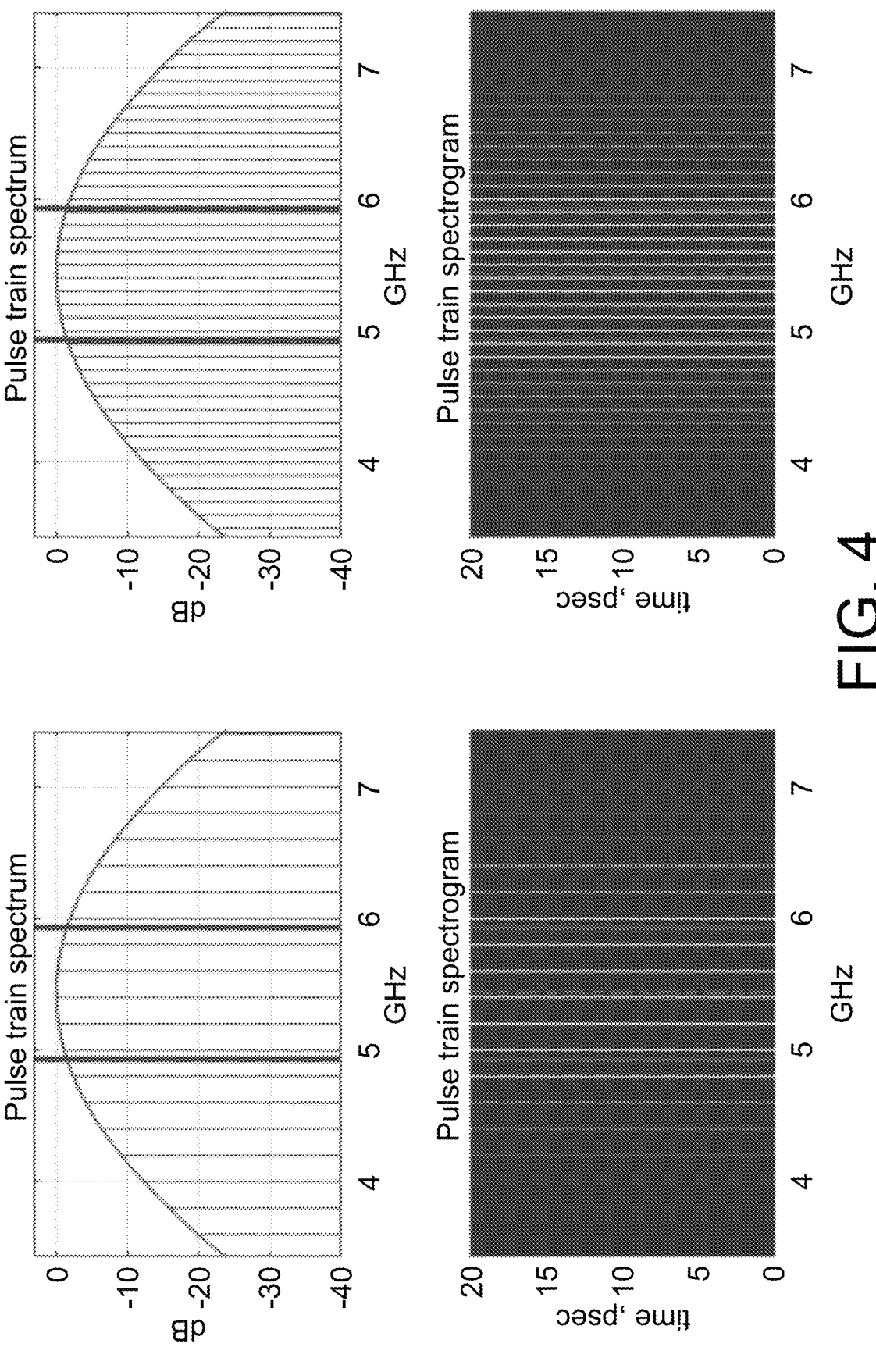
FIG. 4 represents a spectrum and a spectrogram for two examples of pulse trains without PRF modulation.

In the absence of PRF modulation, in other words when the repetition frequency is constant, the last term of the expression (6) is simply a uniform Dirac comb in the frequency domain:

[Math. 8]

$$TF(\Sigma_k \delta(t-t_k)) = \Sigma_k \delta(f - k \cdot PRF) \qquad (7)$$

wherein the discrepancy between the lines is equal to the repetition frequency. FIG. 4 represents in its upper portion the spectrum of two pulse trains for a carrier frequency $f_c$=5.4 GHz and with a constant repetition frequency. The case illustrated to the left corresponds to a 200 MHz PRF and that one to the right to a 100 MHz PRF. The bandwidth to be analysed, $W_{RF}$, is in both cases equal to 1 GHz. The spectrograms corresponding to these two cases have been represented in the lower portion of the figures. In the absence of PRF modulation, the spectral lines are fixed and no scanning is performed in the band to be analysed.

Figure 5:
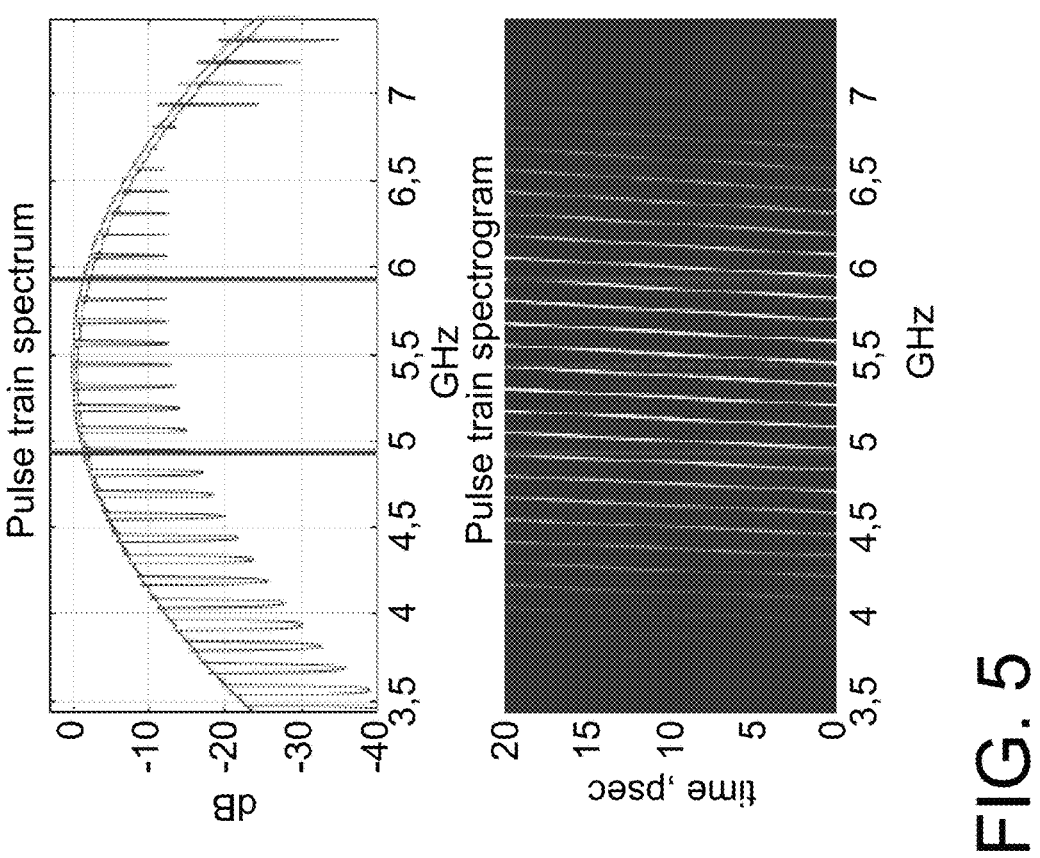
FIG. 5 represents a spectrum and a spectrogram for two examples of pulse trains with first and second PRF modulations.
Figure 5:
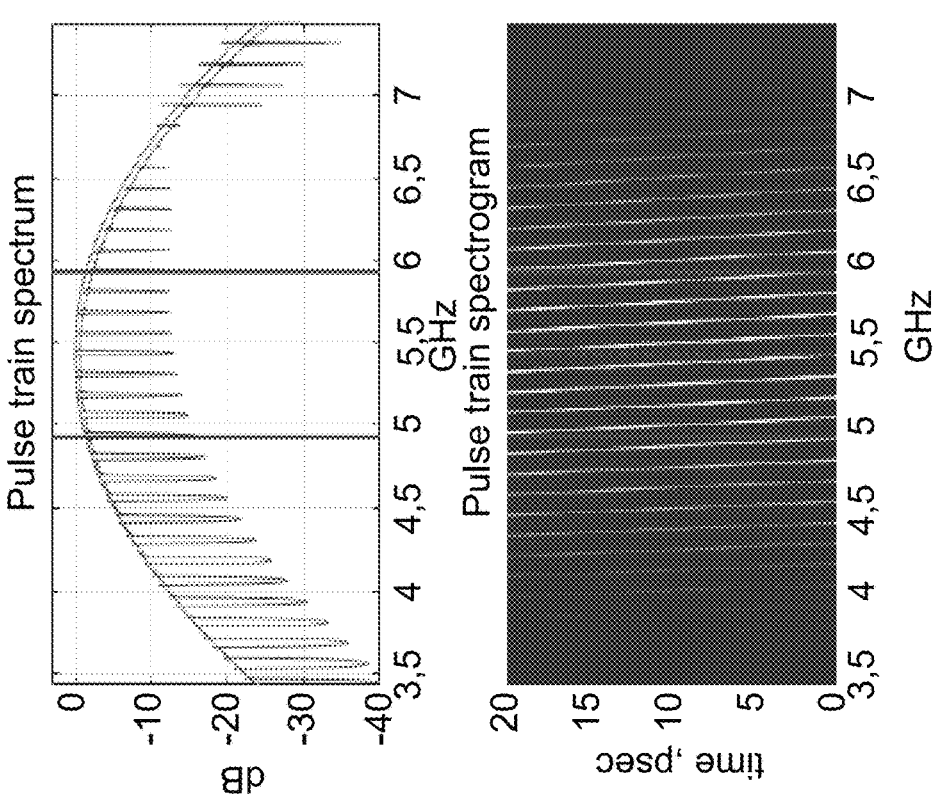

FIG. 5 represents in its upper portion the spectrum of two pulse trains for a carrier frequency $f_c$=5.4 GHz but with a repetition frequency modulated around the average value $\overline{PRF}$=200 MHz. The frequency swing over the sensing duration, $T_{acq}$, is $B_{in}$=5 MHz, the repetition frequency decreasing linearly in the case illustrated to the left of the figure and increasing linearly in the case illustrated to the right.

Instead of a line spectrum, a sub-band spectrum is observed.

In this spectrum, each k-order harmonic of the repetition frequency $\overline{PRF}$ gives rise to a sub-band with a width $B_{sweep}{}^k = (k_{mult} + k - 1) \cdot B_{in}$ where $k_{mult}$ is the integer defined by $k_{mult}$. It should be noticed in the figure that the sub-bands are even wider as the order of the harmonic is high. Moreover, each of the sub-bands is solved to the extent that $B_{sweep}{}^k < PRF_{min}$ where $PRF_{min}$ the lowest PRF value observed over the sensing duration, $T_{acq}$. In other words, $PRF_{min} = PRF_{start}$ for a modulation by increasing values and $PRF_{min} = PRF_{stop}$ for a modulation by decreasing values.

The spectrograms corresponding to the aforementioned two have been represented in the lower portion of the figure. The spectrogram to the left corresponds to a PRF modulation by decreasing values and that one to the right to a PRF modulation by increasing values. One could see that the lines corresponding to the different harmonics move over time towards the low frequencies in the first case and towards the high frequencies in the second case. Given the fact that $B_{sweep} < PRF_{min}$, the variation ramps of adjacent lines do not overlap over the sensing duration.

Figure 6:
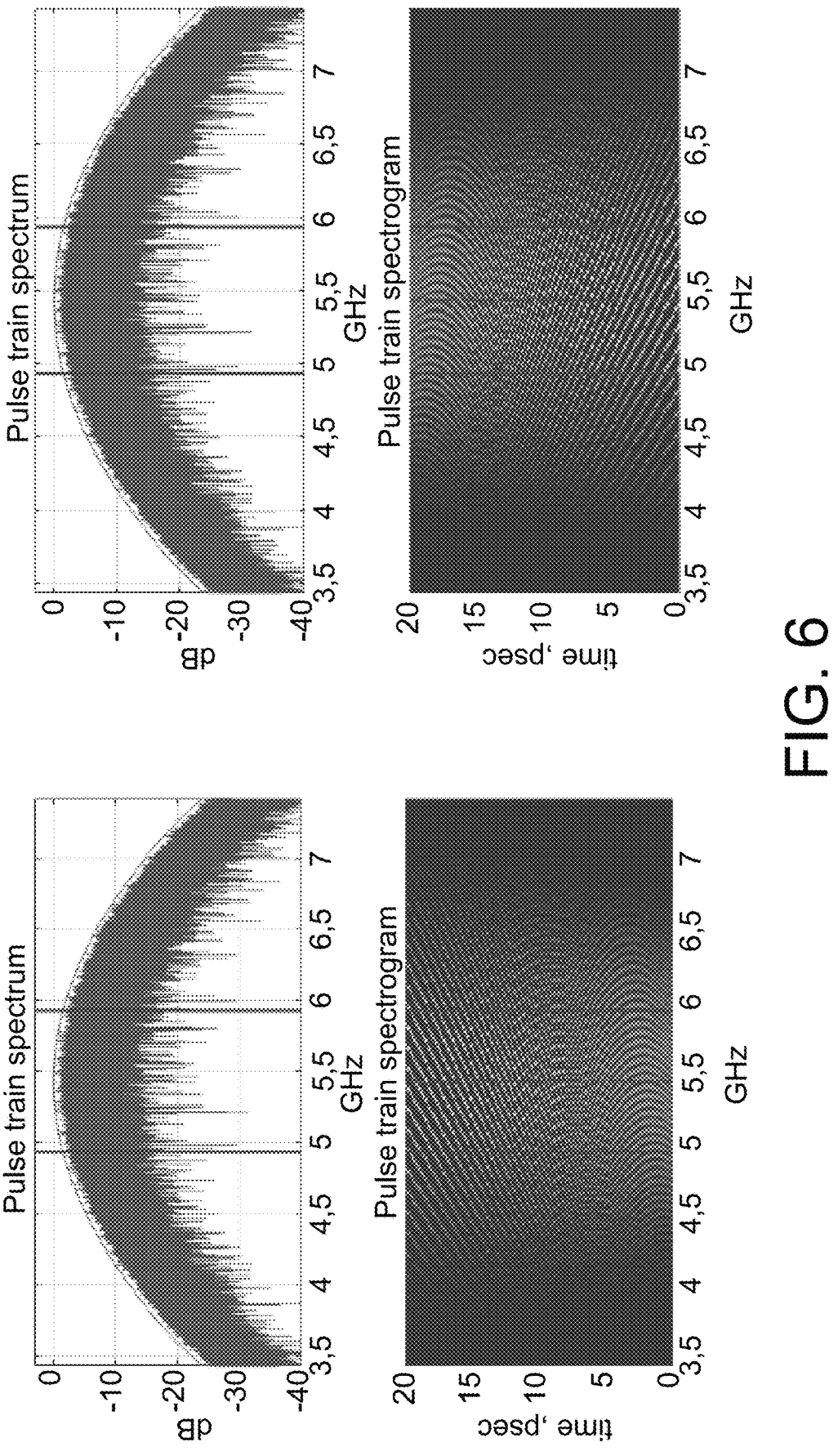
FIG. 6 represents a spectrum and a spectrogram for two examples of pulse trains with first and second PRF modulation, implemented in a compressed sensing method according to an embodiment of the present invention.

Again, FIG. 6 represents in its upper portion the spectrum of two pulse trains for a carrier frequency $f_c$=5.4 GHz with a repetition frequency modulated around the average value $\overline{PRF}$=200 MHz. Like in the previous figure, the repetition frequency decreases linearly in the case illustrated to the left of the figure and increases linearly in the case illustrated to the right. The frequency swing of the $\overline{PRF}$, $B_{in}$, over the duration of sensing is herein selected so that $T_{acq}$, in other words the sub-bands generated by the different harmonics herein overlap, at least for the harmonics with the high orders. In the case illustrated in FIG. 6, $B_{sweep}{}^k > PRF_{max}$ where $PRF_{max}$ the highest PRF value observed over the sensing duration, $T_{acq}$. In other words, $PRF_{max}$=$PRF_{stop}$ for a modulation by increasing values and $PRF_{max}$=$PRF_{start}$ for a modulation by decreasing values. It should be noticed that all sub-bands overlap and consequently none could be solved.

The spectrograms corresponding to the aforementioned two cases are represented in the lower portion of the figure. Because of the overlap of the sub-bands, the spectrograms are dense in the RF sensing band.

According to the present invention, modulating the repetition frequency of the pulses over the sensing duration, $T_{acq}$, allows obtaining a distribution with a less marked probability around the maximum repetition frequency, in other words barely, and even never, resorting to the least sampling step $(BW_{RF})^{-1}$. Consequently, it is possible to use converters operating at a low average rate or frequency $\overline{PRF}$ while enabling the reconstruction of the signal as described hereinafter, which allows limiting energy consumption. This average rate $\overline{PRF}$ meets as much possible as it could be $\overline{PRF} < 2$ $BW_{RF}$, and preferably $\overline{PRF} < BW_{RF}$.

Surprisingly, this property remains true when the sub-bands derived from the different harmonics overlap.

The reconstruction of the signal is carried out based on the complex samples obtained by the compressed sensing method described hereinabove. These samples are the result of a non-uniform sampling, controlled by the repetition frequency modulated over time. It should be noted that this non-uniform sampling does not meet Nyquist theorem and consequently induces spectrum aliasing in the sensed signal. Consequently, a specific reconstruction method is necessary.

It is possible to consider that each complex sample, $s_n$, is the result of the convolution of one single pulse of the pulse train weighted by the input signal $s(t)$, with the pulse response of the AGC filter:

[Math. 9]

$$s_n = \delta(t - t_n{}^s) \cdot (h_{agc}(t)) \otimes p_n{}^*(t) \cdot s(t) \tag{8}$$

where $t_n{}^s$ is the nth sampling time point, $h_{agc}(t)$ is the pulse response of the AGC filter, $p_n{}^*(t)$ is the complex conjugate of the nth pulse and $p_n{}^*(t)$ is the signal at the output of the LNA amplifier, before mixing with the pulse train.

Next, it is assumed that the AGC filter has a bandwidth larger than the band covered by the pulse train and that the phase response of the filter is linear in the band thus covered. In this case, the filter may be considered as a mere delay cell, with a delay $\tau_d$ and with a gain $\tau_d$ and:

[Math. 10]

$$s_n = \delta(t - t_n{}^s) \cdot \gamma_{agc} \cdot p_n{}^*(t - \tau_d) \cdot s(t - \tau_d) \tag{9}$$

By selecting $t_n{}^s = t_n + \tau_d$ and by performing a time reference change, we obtain by multiplying the two members of the equation by $p_n(t)$:

[Math. 11]

$$s_n \cdot p_n(t) = \gamma_{agc} \cdot \delta(t - t_n) \cdot p_n{}^*(t) p_n(t) \cdot s(t) \tag{10}$$

[Math. 12]

$$TF(s_n \cdot p_n(t)) = s_n P_n(f) = \gamma_{agc} \cdot p_n{}^*(t_n) p_n(t_n) \cdot s(t_n) e^{-j2\pi f t_n} = \gamma \cdot s$$
$$(t_n) e^{-j2\pi f t_n} \tag{11}$$

given that $p_n{}^*(t_n) p_n(t_n)$ is a real constant.
It is then possible to reconstruct the signal by means of:

[Math. 13]

$$\hat{X}(f) = \frac{1}{\gamma} \sum_{n=1}^{Nmax} s_n P_n(f) = \sum_{n=1}^{Nmax} s(t_n) \cdot e^{-j2\pi f t_n} \tag{12}$$

The term to the right is simply the value of the spectrum taken at the frequency f obtained by interpolation of the phasors $e^{-j2\pi f t_n}$ by the samples $s(t_n)$. The signal $x(t)$ can then be estimated by inverse Fourier transform $\hat{x}(t) = TF^{-1}(\hat{X}(f))$.

Figure 7:
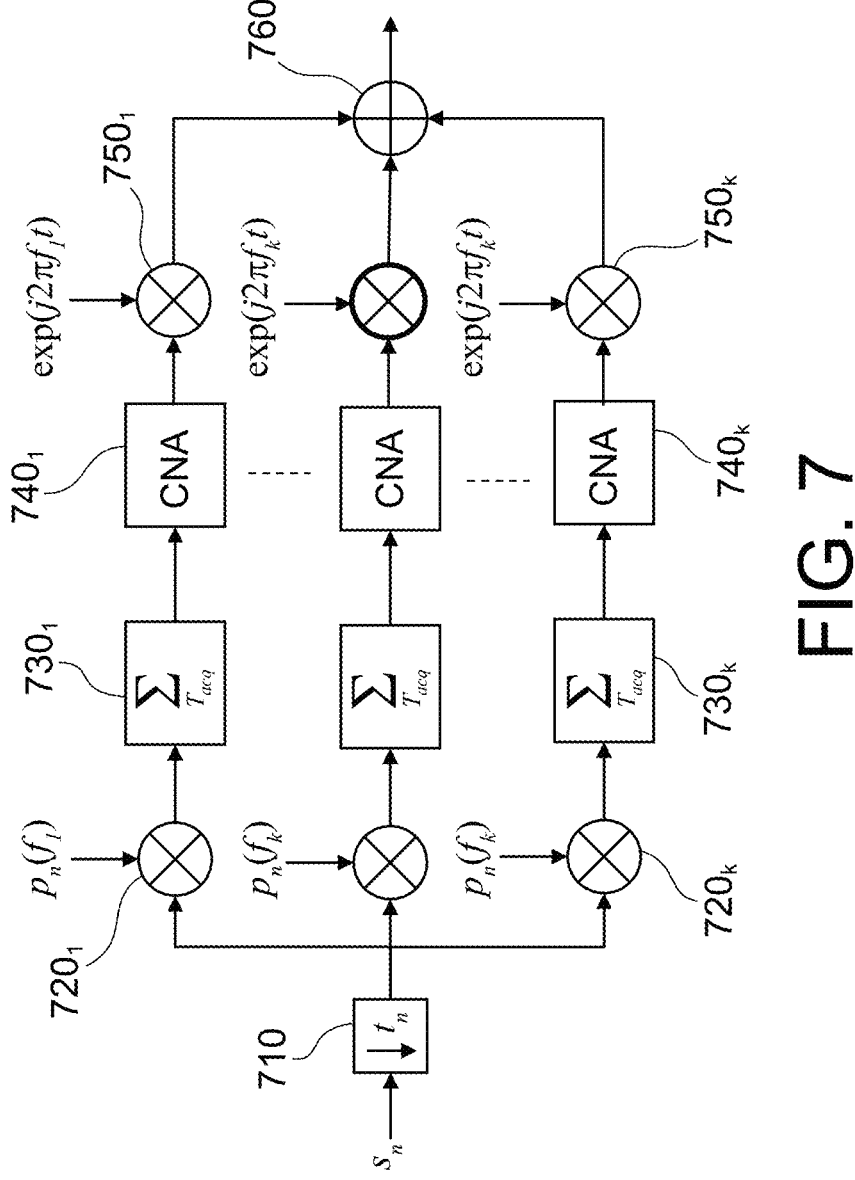
FIG. 7 schematically represents a module for reconstruction of a signal having undergone a compressed sensing according to an embodiment of the present invention.

FIG. 7 schematically represents a module for reconstructing a signal having undergone a compressed sensing according to an embodiment of the present invention.

The reconstruction module receives the complex samples $s_n$ at a variable rate, at the time points to (defined by the expression (3)), the samples being stored in a FIFO buffer 710. Afterwards, the samples are read at a constant rate and respectively multiplied by the spectral values $P_n(f_1)$, ..., $P_n(f_K)$ by the multipliers $720_1$, ..., $720_K$ where $P_n(f)$ is the Fourier transform of the nth pulse and $f_1$, ..., $f_K$ are frequencies equidistributed over the band of interest to be analysed, $BW_{RF}$. The summation modules $730_1$, ..., $730_K$ sum up the results obtained for the duration of the sensing frame, in other words over the pulse train and the summation results weighting the phasors $\exp(j2\pi f_1 t)$, ..., $\exp(j2\pi f_K t)$ in the multipliers $750_1$, ..., $750_K$. Where appropriate, the multiplication with the phasors may be carried out in the analog domain by performing a prior conversion of the results of summation by means of the optional ADC converters, $750_1$, ..., $750_K$, represented in dashed lines.

In any case, the phasors thus weighted are summed up afterwards in the adder 760 to result in an estimate of the received signal, $\hat{x}(t)$.

Figure 8:
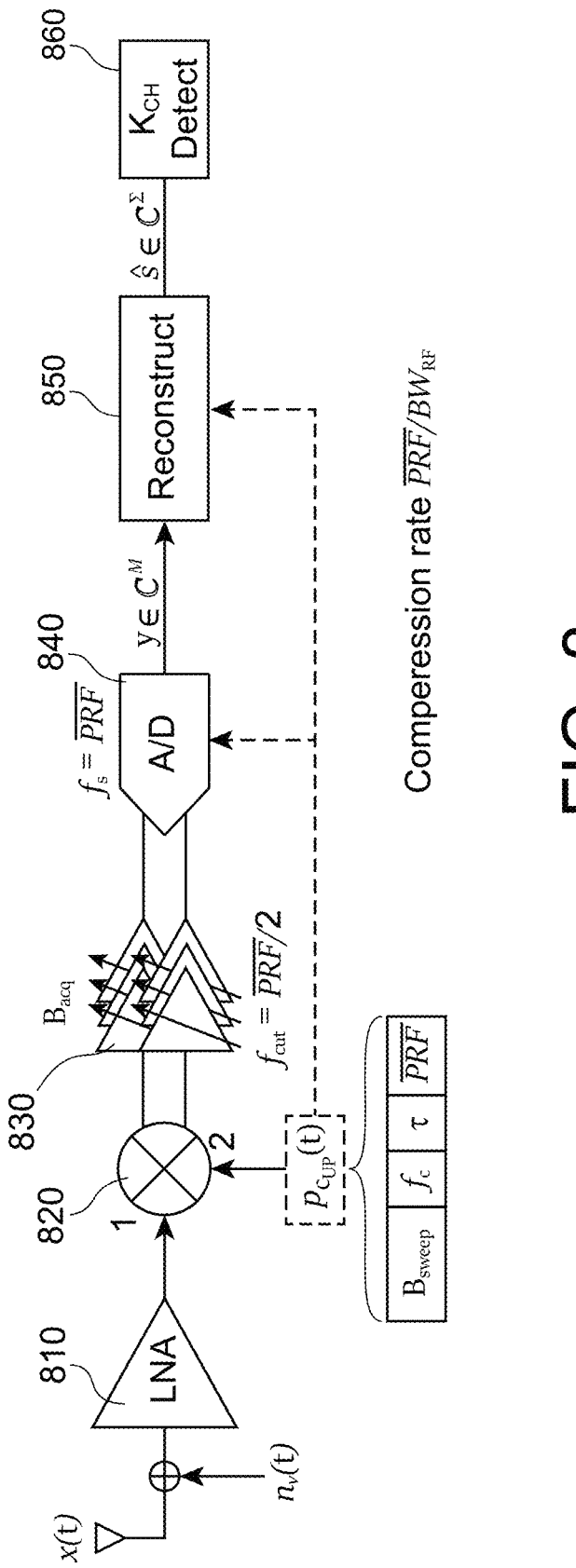
FIG. 8 schematically represents a device for compressed sensing and reconstruction of a signal according to a first variant of the present invention.

FIG. 8 schematically represents a device for compressed sensing and reconstruction of a signal according to a first variant of the present invention.

The compressed sensing and reconstruction device comprises a low-noise amplifier, 810, a complex mixer, 820 (channels I and Q) of the amplified signal with a pulse train with modulated PRF as described hereinabove, with $\overline{PRF} < BW_{RF}$, the PRF modulation may be performed by increasing or decreasing values. The result of mixing is filtered by an AGC filter, 830, with a cut-off frequency equal to $\overline{PRF}/2$ then converted by an analog-to-digital converter (on each of the channels I and Q), 840. The complex samples derived from the compressed sensing are input into a reconstruction module as described before in connection with FIG. 7 to obtain an estimate of the received signal. In some cases, when the band $BW_{RF}$ is divided into channels, it might be interesting to scan the considered band to determine in which channel a signal is emitted. Assuming that there are K such channels, it is then possible to contend with performing a detection at the output of the adders $730_1, \ldots, 730_K$ to deduce the used channel(s), as represented by the detection module 860. When a channel is determined to be used, a compressive sensing by means of a pulse train with constant PRF can be performed by selecting the PRF so as not to induce an aliasing in the considered channel.

Figure 9:
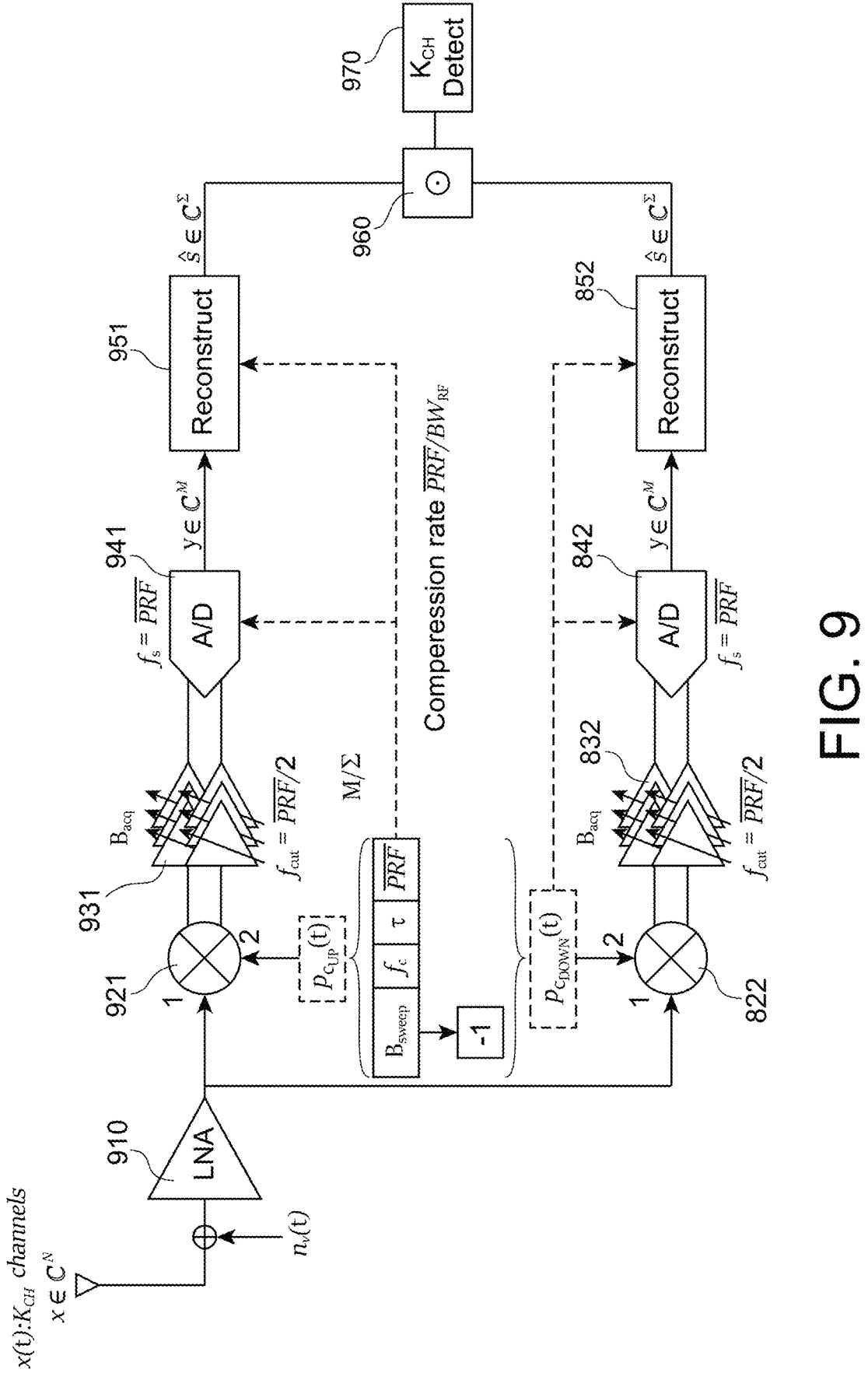
FIG. 9 schematically represents a device for compressed sensing and reconstruction of a signal according to a second variant of the present invention.

FIG. 9 schematically represents a device for compressed sensing and reconstruction of a signal according to a second variant of the present invention.

This second variant differs from the first one in that after amplification in the low-noise amplifier, 910, the amplified signal is subjected in parallel to a first compressed sensing chain 921-941, in which the amplified signal is mixed with a first pulse train with a PRF modulated by increasing values and to a second compressed sensing chain 922-942, in which the amplified signal is mixed with a second pulse train with a PRF modulated by decreasing values. Advantageously, the first and second compressed sensing chains will use the same sensing frame duration, $T_{acq}$, as well as the same pulse, and therefore a same carrier frequency $f_c$ and a same waveform with a duration $\tau$. However, these two compressed sensing chains use modulation ramps with opposite slopes, $2\alpha$ for the first one and $-2\alpha$ for the second one. Thus, the PRF of the first pulse train varies from $PRF_{min}$ to $PRF_{max}$ and the second pulse train varies from $PRF_{max}$ to $PRF_{min}$ for the duration of the sensing frame. It should be understood that the time positions of the pulses in the first and second pulse trains are thus different, which allows reducing even more the average value of the repetition frequency, $\overline{PRF}$, common to the two branches, yet at the expense of a larger circuit size.

Afterwards, the complex samples originating from the first branch are supplied to a first reconstruction module, 951, and those originating from the second branch to a second reconstruction module, 952, each module using the pulse train used in the corresponding branch.

In this second variant, the signals originating from the reconstruction modules originate from the adders $730_1, \ldots, 730_K$ as represented in FIG. 7, the addition being performed over time intervals, whose duration $T_{acq}/M$ is a fraction of the sensing period $T_{acq}$.

The signals reconstructed by 951 and 952 are multiplied, frequency-by-frequency, and for each frequency, $f_k$, the multiplication results are summed up over the M intervals, to obtain an estimate of the signal at the frequencies $f_1, \ldots, f_K$. It is possible to demonstrate that this operation allows attenuating parasitic lines (resulting from aliasing) in the spectrogram.

Like in the first variant, the device of FIG. 9 can be used to scan a band $BW_{RF}$ divided into channels. In this case, a detection is carried out after the aforementioned summation over the M intervals. Herein again, when a channel is determined to be used, a compressed sensing by means of a pulse train with a constant PRF can be carried out afterwards. It should then be understood that the PRF could be half of that one implemented in the first variant, the time positions of the pulses in the two pulse trains being decimated by a 2 factor, the first pulse train may comprise pulses at the time positions with odd orders and the second one amongst the pulses at the time positions with even orders.

The invention claimed is:

1. A method of compressed sensing of a received signal that is a spectrally-sparse signal within a given spectral band comprising:

mixing the received signal over a sensing frame with a pulse train, having a plurality of pulses, scrolling at a repetition frequency within this frame, said pulses having a duration shorter than or equal to an inverse of a width of the spectral band and having a spectrum centered on a central frequency of this band; and filtering a result of the mixing by a low-pass filter before being sampled to result in complex samples representative of the received signal, said method including modulating said repetition frequency over time for a duration of the sensing frame, wherein the repetition frequency covers over the sensing frame a range of repetition frequencies between a minimum value $PRF_{min}$ and a maximum value $RF_{max}$, either increasingly, or decreasingly.

2. The compressed sensing method according to claim 1, wherein the repetition frequency is linearly modulated over time.

3. The compressed sensing method according to claim 1, wherein for at least one k-order spectral line of the pulse train and preferably for a plurality of such lines, a modulation swing of the repetition frequency ($B_{in}$) is selected so that a spectral width ($B_{sweep}{}^k$) covered by at least one k-order spectral line of the pulse train is wider than an average repetition frequency ($\overline{PRF}$) of the pulses for the duration of the sensing frame.

4. The compressed sensing method according to claim 1, wherein a modulation swing of the repetition frequency ($B_{in}$) is selected so that a spectral width covered by each spectral line of the pulse train, $B_{sweep}{}^k=(k_{mult}+k-1)\cdot B_{in}$ is such that $B_{sweep}{}^k>PRF_{min}$ where $k_{mult}$ is the integer defined by $$k_{mult} = \left\lfloor \frac{f_c}{\overline{PRF}} \right\rfloor,$$

$f_c$ is said central frequency, and $\overline{PRF}$ is an average repetition frequency of the pulses for the duration of the sensing frame.

5. The compressed sensing method according to claim 1, wherein the pulses are selected from Morlet wavelets, Haar wavelets and Gabor functions.

6. The compressed sensing method according to claim 1, wherein the low-pass filter has a cut-off frequency substantially equal to $\overline{PRF}/2$ where $\overline{PRF}$ is an average repetition frequency of the pulses for the duration of the sensing frame.

7. The compressed sensing method according to claim 1, wherein at time positions indicating a start of the pulses, a phase variation due to the modulation of the repetition frequency is an integer multiple of $2\pi$.

8. The compressed sensing method according to claim 1, wherein an average repetition frequency ($\overline{PRF}$) of the pulses for the duration of the sensing frame is less than double of the width ($BW_{RF}$) of the spectral band.

9. The compressed sensing method according to claim 1, wherein the received signal is mixed over a sensing frame with a first pulse train scrolling at a first repetition frequency within the sensing frame, and over this same sensing frame, is mixed with a second pulse train scrolling with a second repetition frequency, the first and second repetition frequencies being linearly modulated over time, the first pulse train and the second pulse train having modulation ramps with opposite slopes.

10. The compressed sensing method according to claim 9, wherein the result of mixing with the first pulse train is filtered by a first low-pass filter before being sampled to result in first complex samples, and that the result of mixing with the second pulse train is filtered by a second low-pass filter before being sampled to result in second complex samples, all of the first and second complex samples being representative of the received signal.

11. A method of reconstructing a spectrally-sparse signal within a given spectral band, said spectrally-sparse signal having undergone a compressed sensing by a compressed sensing method according to claim 1, wherein the complex samples relating to the pulses of the pulse train are, in an operation, successively multiplied by spectral values of the pulses to result in weighted spectral values, this operation being repeated for a plurality of frequencies equidistributed over the spectral band, said weighted spectral values being summed up for the duration of the sensing frame for each frequency of the plurality of equidistributed frequencies to obtain complex coefficients at each of the frequencies, phasors at these frequencies being then weighted by said corresponding complex coefficients before being summed up to result in an estimate of the received signal.

* * * * *